United States Patent
Parris et al.

(10) Patent No.: US 7,180,363 B2
(45) Date of Patent: Feb. 20, 2007

(54) POWERGATING METHOD AND APPARATUS

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/900,505

(22) Filed: Jul. 28, 2004

(65) Prior Publication Data

US 2006/0022742 A1 Feb. 2, 2006

(51) Int. Cl.
*G05F 1/10* (2006.01)
*G05F 3/02* (2006.01)

(52) U.S. Cl. .......................... 327/544; 327/55
(58) Field of Classification Search ................ 327/544, 327/55; 365/227
See application file for complete search history.

(56) References Cited

U.S. PATENT DOCUMENTS

| | | | | |
|---|---|---|---|---|
| 5,365,487 A | | 11/1994 | Patel et al. ................ | 365/226 |
| 5,451,897 A | * | 9/1995 | Komuro .................... | 327/544 |
| 5,814,851 A | * | 9/1998 | Suh .......................... | 257/296 |
| 5,933,384 A | * | 8/1999 | Terada et al. .............. | 365/227 |
| 5,973,552 A | | 10/1999 | Allan ........................ | 327/544 |
| 6,115,316 A | * | 9/2000 | Mori et al. ............. | 365/230.03 |
| 6,169,419 B1 | | 1/2001 | De et al. ..................... | 326/58 |

OTHER PUBLICATIONS

Min, Kyeong-Sik, Kawaguchi, Hiroshi, Sakurai, Takayasu, Zigzag Super Cut-off CMOS (ZSCCMOS) Block Activation with Self-Adaptive Voltage Level Controller: An Alternative to Clock-Gating Scheme in Leakage Dominant Era, ISSCC 2003/Session 22/TD: Embedded Technologies/ Paper 22.8, 2003 IEEE International Solid-State Circuits Conference, Feb. 12, 2003/ Salon 1-6, pp. 10.

* cited by examiner

*Primary Examiner*—Quan Tra
(74) *Attorney, Agent, or Firm*—Peter J. Meza; William J. Kubida; Hogan & Hartson LLP

(57) ABSTRACT

A powergating circuit includes a P-channel transistor with a source coupled to VCC, a gate for receiving a first boosted or non-boosted powergating control signal, and a drain forming the internal switched VCC power supply. An N-channel transistor has a source coupled to VSS, a gate for receiving a second boosted or non-boosted powergating control signal, and a drain forming the internal switched VSS power supply. The powergating circuit further includes a circuit for forcing the first and second internal power supply voltages to a mid-point reference voltage during the standby mode.

6 Claims, 6 Drawing Sheets

POWERGATING METHOD AND APPARATUS

BACKGROUND OF THE INVENTION

The present invention relates, in general, to the field of powergating in integrated circuits, such as integrated circuit memories. More particularly, the present invention relates to a powergating method and apparatus in which the internal switched power supply voltage rails are fixed at a mid-point voltage during the standby mode of operation.

Various approaches to powergating have been used in the past wherein the internal or powergated internal power supply voltage rails are allowed to float during the low leakage standby mode. Since the floating voltage is not controlled, the internal power supply voltages can traverse the entire voltage range from the VCC power supply to the VSS power supply. Alternatively, other prior art approaches force the internal rail to the opposite power supply voltage during the standby mode. For example the internal VCC rail may be forced to a voltage at or near VSS, whereas the internal VSS rail may be forced to a voltage at or near VCC.

Both of these two powergating approaches can be present reliability problems due to excessive voltage across the gate oxides of the powergating switching transistors. For thin oxide devices, this excess voltage could cause breakdown and other reliability problems. Alternatively, these two powergating approaches could create manufacturability and cost concerns by requiring a thicker gate oxide where a thinner gate oxide would be preferred.

A typical prior art powergating circuit is shown in FIG. 1. Powergating circuit 10 includes a P-channel transistor M1 having a source coupled to the VCC power supply, a gate for receiving the PPG control signal for switching between the active and standby modes, and a drain for providing the switched PGVCC internal power supply voltage. Powergating circuit 10 also includes an N-channel transistor M2 having a source coupled to the VSS power supply or ground, a gate for receiving the NPG control signal for switching between the active and standby modes, and a drain for providing the switched PGVSS internal power supply voltage. A power-controlled circuit 12 has its power supply terminals coupled to the internal power supplies provided by the drains of transistors M1 and M2.

The reliability problem referred to above could be exacerbated if the PPG and NPG control signals are at boosted voltage levels as taught in co-pending U.S. patent application Ser. No. 10/325,524, entitled "Powergate Control Using Boosted and Negative Voltages", filed on Dec. 19, 2002, which is hereby incorporated by reference. Referring to FIG. 2, during standby, either PGVCC goes to or near VSS or PGVSS goes to or near VCC. The PGVCC voltage is shown to undesirably extend below a mid-point voltage 14 in FIG. 2. Similarly, the PGVSS voltage is shown to undesirably extend above a mid-point voltage 14 in FIG. 2. The PPG control signal may go to a voltage above VCC and the NPG control signal may go to a voltage below ground or VSS. In this case the voltage across the gate oxides of transistors M1 or M2 (specifically the gate-to-drain voltage) could become too large and cause breakdown.

What is desired is a simple powergating circuit for use in an integrated circuit that addresses the reliability problems posed by prior art powergating circuits due to excess voltage dropped across the powergating switching transistors.

SUMMARY OF THE INVENTION

A powergating circuit according to an embodiment of the present invention includes a P-channel transistor with a source coupled to VCC, a gate for receiving a first boosted or non-boosted powergating control signal, and a drain forming the internal switched VCC power supply. An N-channel transistor has a source coupled to VSS, a gate for receiving a second boosted or non-boosted powergating control signal, and a drain forming the internal switched VSS power supply. A controlled circuit such as a CMOS circuit, sense amplifier, or the like, has a first power node coupled to the internal VCC power supply and a second power node coupled to the internal VSS power supply. The powergating circuit of the present invention further includes a circuit for forcing the first and second internal power supply voltages to a mid-point reference voltage during the standby mode.

According to an embodiment of the present invention, the circuit for forcing the first and second internal power supply voltages to a mid-point reference voltage during the standby mode includes a first N-channel transistor having a current path coupled between the internal VCC power supply and a mid-point reference voltage source. A second N-channel transistor has a current path coupled between the internal VSS power supply and the mid-point reference voltage source. The gates of the first and second transistors are coupled together for receiving a gate control signal, which is desirably the first powergating control signal. Ideally, the mid-point reference voltage source is the bit line reference voltage source, which is readily available in integrated memory circuits.

According to an embodiment of the present invention, the internal powergated supplies are forced to a known voltage level between VCC and VSS, utilizing an already existing mid-point power supply, thus avoiding the excessive gate voltages and consequent reliability problems found in prior art powergating circuit designs.

In another embodiment of the present invention, a circuit is provided for driving the latch nodes on a sense amplifier, wherein the internal power supplies coupled to the driving circuit are switched to the mid-point reference level during the standby or low power mode.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
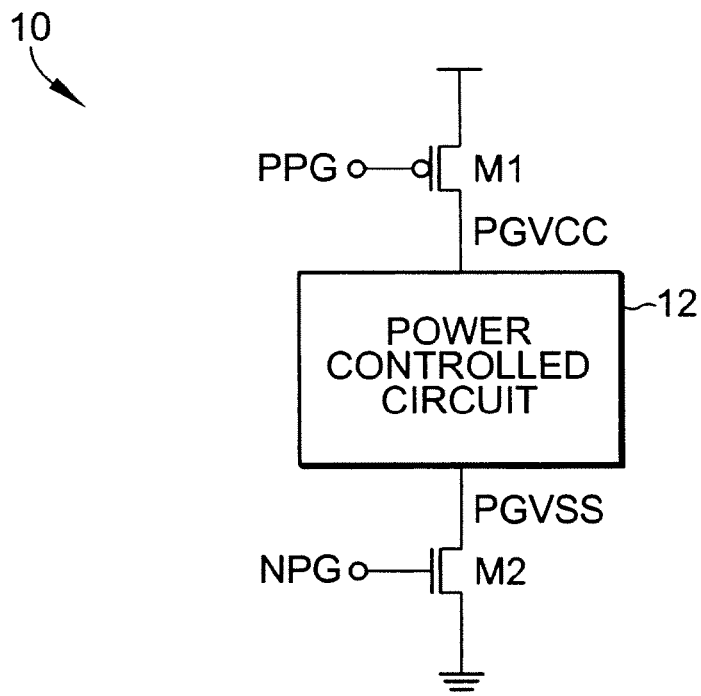
FIG. 1 is a schematic diagram of a prior art powergating circuit.
Figure 2:
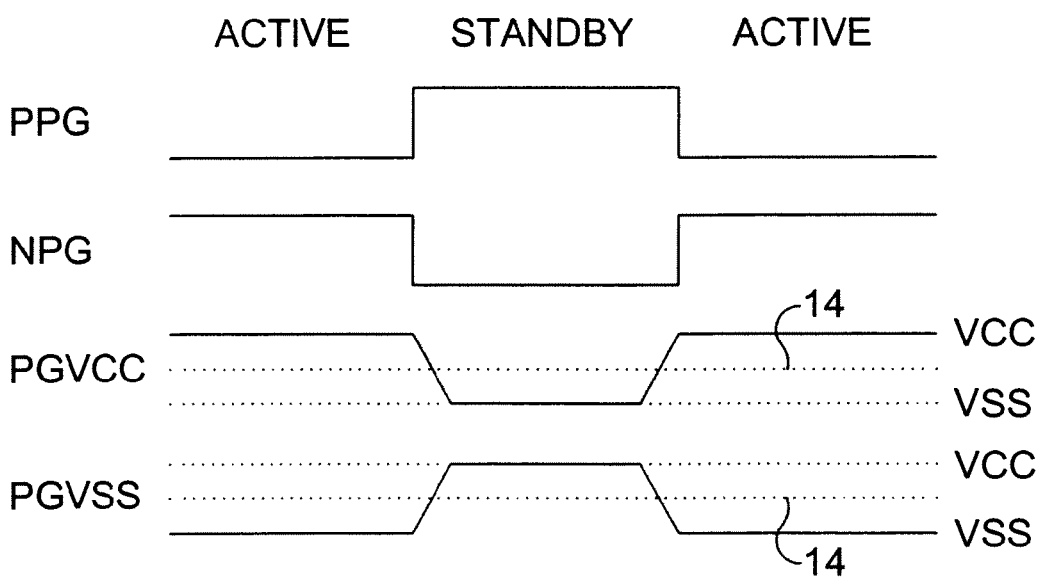
FIG. 2 is a timing diagram illustrating various waveforms associated with the powergating circuit of FIG. 1.
Figure 3:
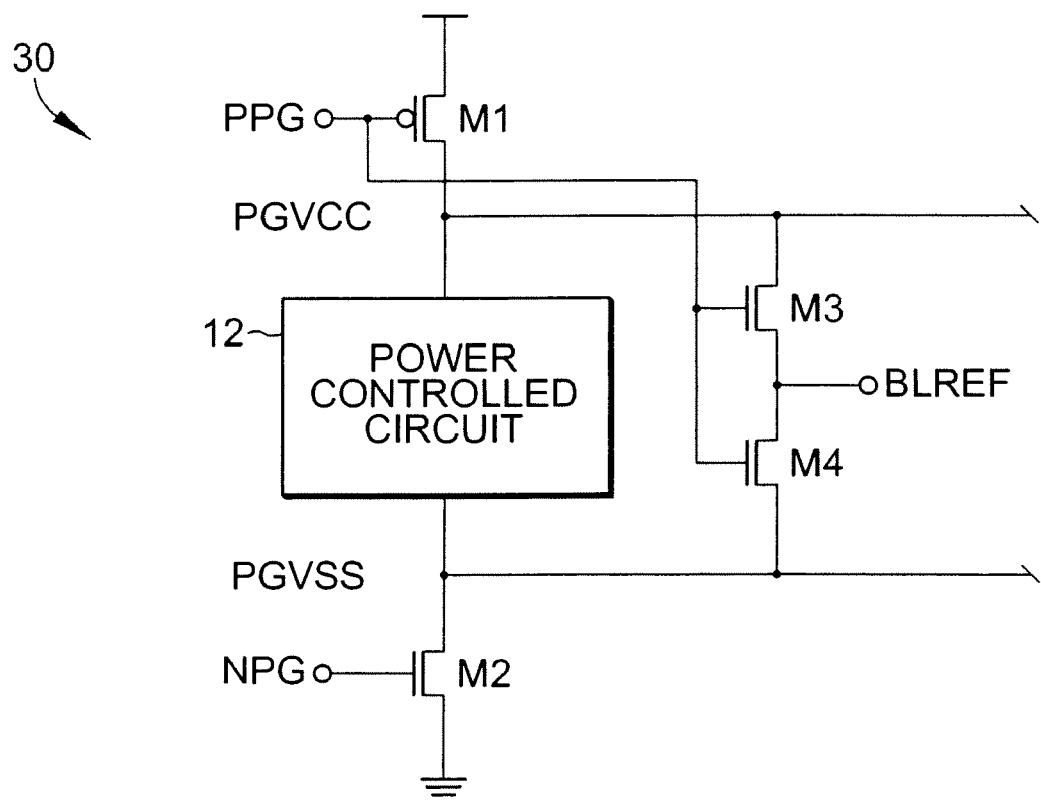
FIG. 3 is a schematic diagram of a powergating circuit according to an embodiment of the present invention.

A powergating circuit 30 according to an embodiment of the present invention is shown in FIG. 3. Powergating circuit 30 includes a P-channel transistor M1 having a source coupled to the VCC power supply, a gate for receiving the PPG control signal for switching between the active and standby modes, and a drain for providing the switched PGVCC internal power supply voltage. Powergating circuit 30 also includes an N-channel transistor M2 having a source coupled to the VSS power supply or ground, a gate for receiving the NPG control signal for switching between the active and standby modes, and a drain for providing the switched PGVSS internal power supply voltage. A power-controlled circuit 12 has its power supply terminals coupled to the internal power supplies providing by the drains of transistors M1 and M2. Powergating circuit 30 further includes N-channel transistors M3 and M4, which have serially-coupled current paths coupled between the PGVCC and PGVSS internal switched power supplies. The common source/drains of transistors M3 and M4 are coupled to a voltage ideally set halfway between the VCC and VSS power supplies. A readily available bit line reference voltage, BLREF, is used for the mid-point reference voltage. The gates of transistors M3 and M4 are coupled together to receive the PPG control signal.

Figure 4:
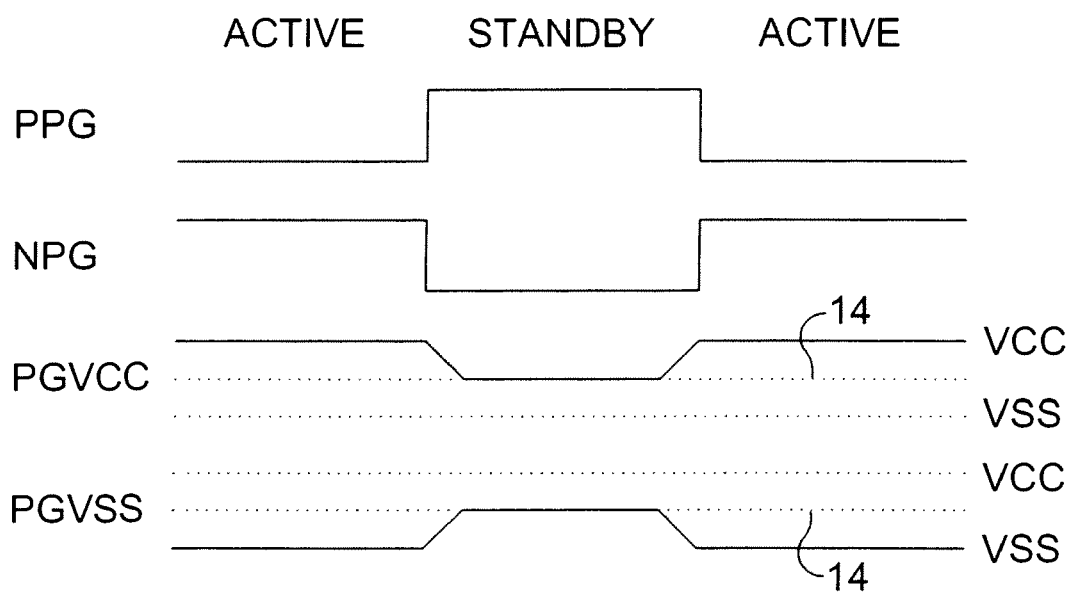
FIG. 4 is a timing diagram illustrating various waveforms associated with the powergating circuit of FIG. 3.

Referring now to FIG. 4, the PPG, NPG, PGVCC and PGVSS waveforms are shown for the circuit of FIG. 3. During the standby mode, the PGVCC waveform is prevented from reaching the VSS voltage and is clamped at the mid-point voltage 14, which is set to the BLREF voltage. BLREF is typically set to (VCC+VSS)/2. Similarly, the PGVSS voltage is prevented from reaching the VCC voltage, and is also clamped at the mid-point voltage 14. In normal standby operation, the voltage across the gate oxides of transistors M1 and M2 is prevented from exceeding (VCC−BLREF) or (BLREF−VSS) and breakdown is prevented. These voltages across the gate oxide will increase slightly if the boosted control signals PPG and NPG are used, but an improvement in reliability will still be realized.

Most DRAMs today include many columns of sense amplifiers. Given the number of sense amplifiers on a typical DRAM integrated circuit, it is important to reduce the leakage power during low power or standby modes.

Figure 5:
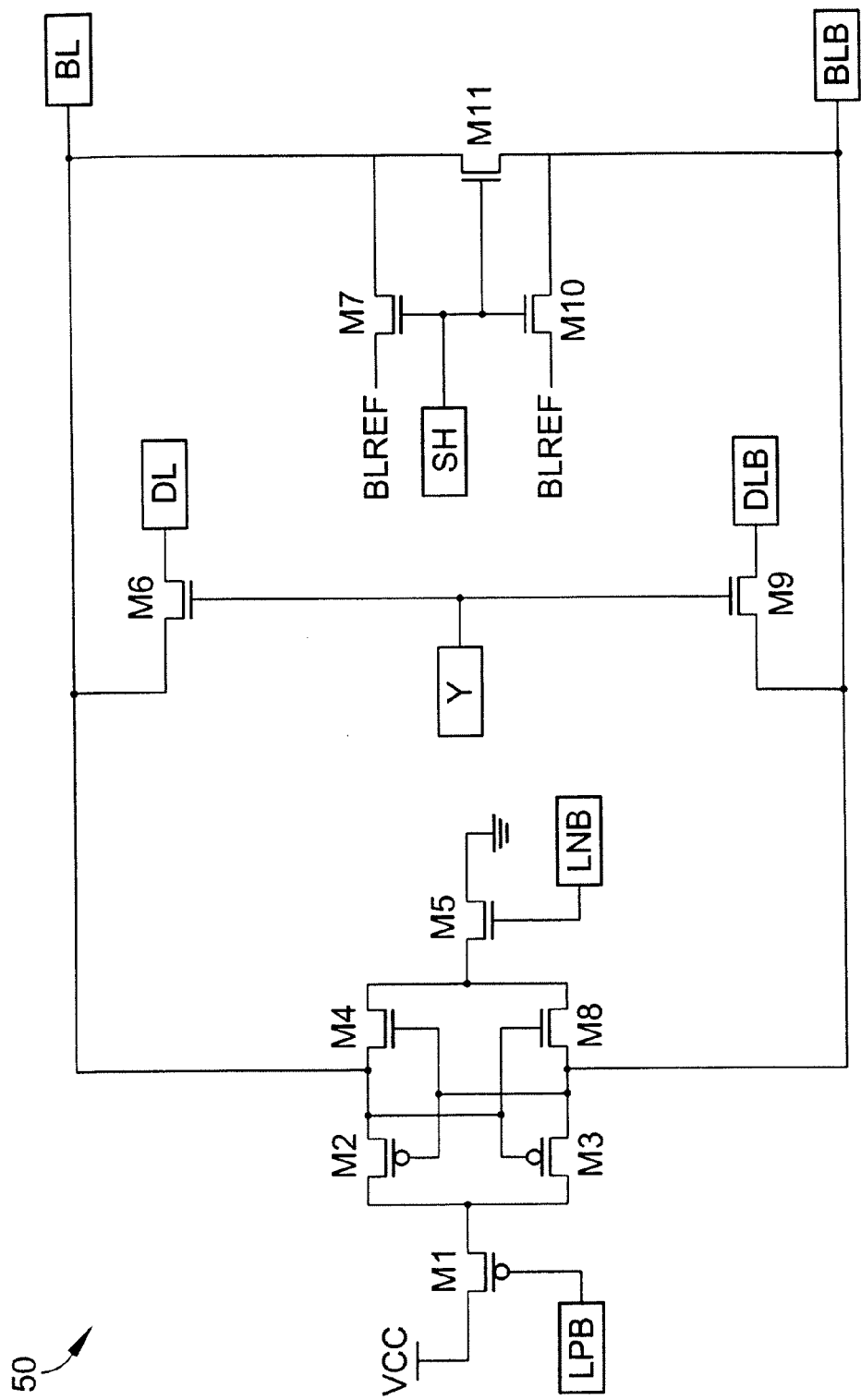
FIG. 5 is a schematic diagram showing a sense amplifier circuit and associated circuitry.

A single sense amplifier 50 and associated circuitry is shown in FIG. 5. Sense amplifier 50 includes cross-coupled P-channel transistors M2 and M3, cross-coupled N-channel transistors M4 and M8, as well as P-channel latch transistor M1, and N-channel latch transistor M5. Transistor M1 is coupled to the VCC power supply and receives an LPB latch signal. Transistor M5 is coupled to the VSS power supply and receives an LNB latch signal. The latch signals are typically used to turn on transistors M1 and M5, which allows transistors M2, M3, M4, and M8 to resolve the data state present on the BL and BLB bit lines. Sense amplifier 50 includes transistors M6 and M9 for transferring the latched data to the DL and DLB data lines under control of the Y control signal. Transistors M7, M10, and M11 are used to equalize the bit lines to the BLREF mid-point voltage level under control of the SH control signal.

Figure 6:
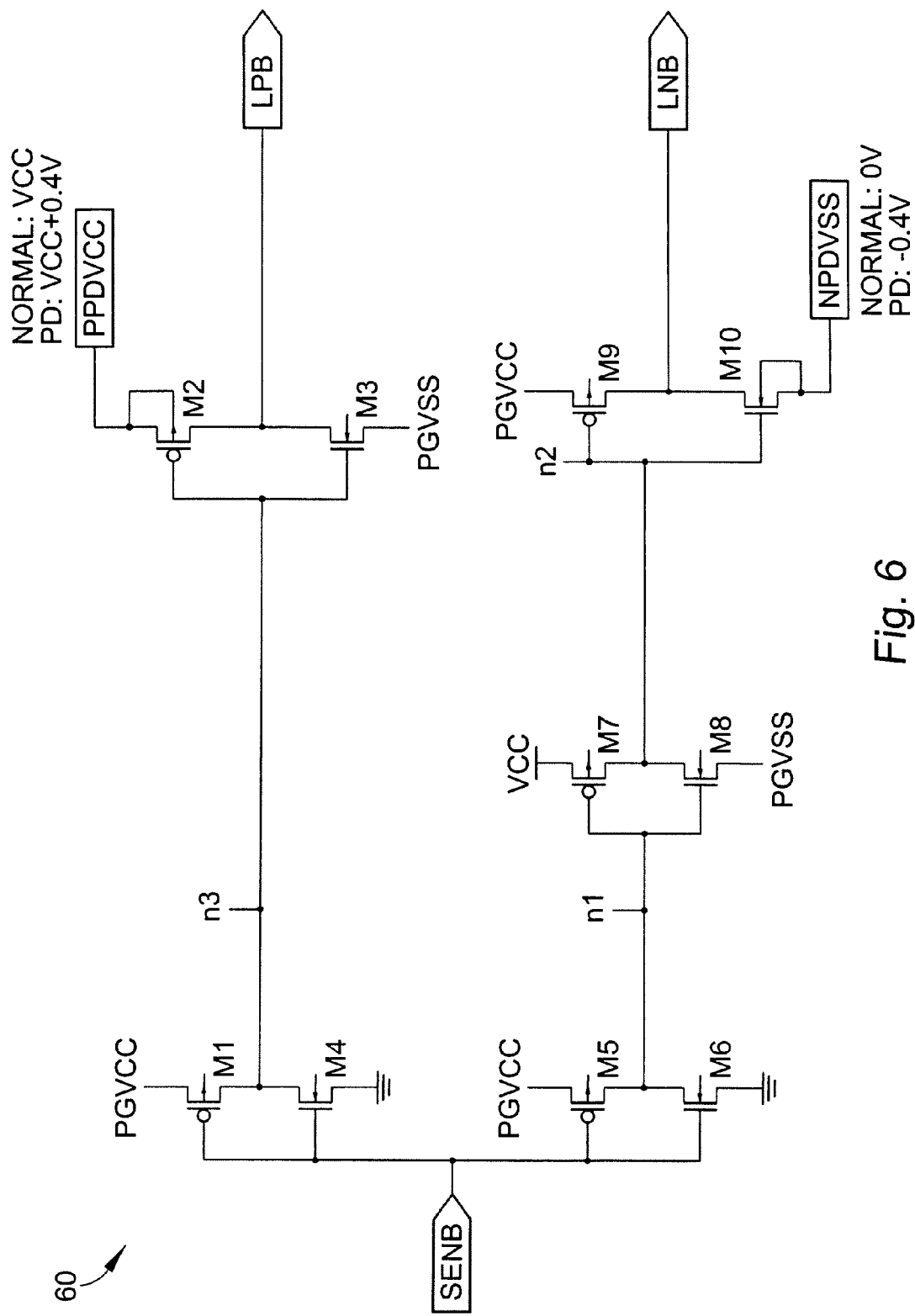
FIG. 6 is a schematic diagram showing a circuit for driving the latch nodes of a sense amplifier.

One way to reduce the power of sense amplifier 50 is to take the LNB and LPB node below VSS and above VCC, respectively, so that the $V_{GS}$ voltages of transistors M1 and M5 become negative. The powergated circuit 60 for providing these voltages is shown in FIG. 6. Circuit 60 includes a SENB control signal for switching the sense amplifier 50 between an active latching mode and a standby or power down mode through the previously described LPB and LNB signals. A first inverter path includes serially connected inverters M1/M4 and M2/M3. Inverter M1/M4 is coupled between PGVCC and VSS or ground. Inverter M2/M3 is coupled between the PPDVCC power supply and the PGVSS internal power supply. The PPDVCC power supply has a value of VCC during normal operation, and a value of VCC+0.4 volts during the standby mode of operation. Transistors M1 and M4 are thin oxide transistors having a length of 0.07 μ. Transistors M2 and M3 are thicker oxide transistors having a length of 0.22 μ. A second inverter path includes serially connected inverters M5/M6, M7/M8 and M9/M10. Inverter M5/M6 is coupled between PGVCC and VSS or ground. Inverter M7/M8 is coupled between VCC and PGVSS. Inverter M9/M10 is coupled between PGVCC and the NPDVSS power supply. The NPDVSS power supply has a value of zero volts during normal operation, and a value of negative 0.4 volts during the standby mode of operation. Transistors M5, M6, M7 and M8 are thin oxide transistors having a length of 0.07 μ. Transistors M9 and M10 are thicker oxide transistors having a length of 0.22 μ. For a representative fabrication technology only according to an embodiment of the present invention, the gate oxide layer of the thicker transistors are about 35 Angstroms thick and the gate oxide layer of the thinner transistors are about 17 Angstroms thick.

Figure 7:
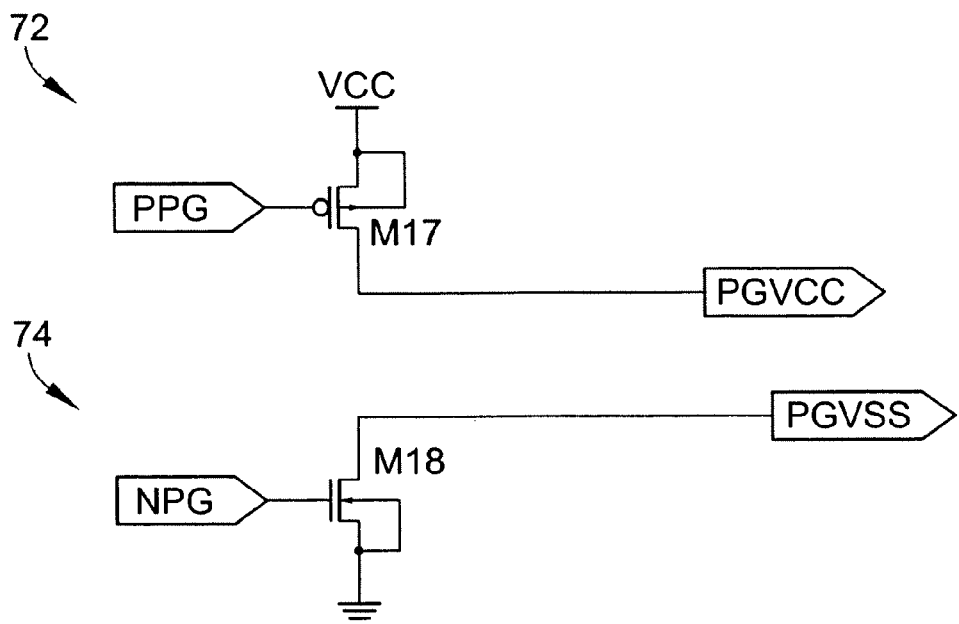
FIG. 7 is a schematic diagram showing a circuit for providing the internal switched VCC and VSS power supply voltages to the circuit of FIG. 6.

Referring to FIG. 7, circuits 72 and 74 are shown for providing the PGVCC and PGVSS internal switched power supply voltages. Circuit 72 is a P-channel transistor M17 wherein the source and body contact are coupled to VCC, the gate receives the PPG powergating control signal, and the drain provides the switched PGVCC supply voltage. Circuit 74 is an N-channel transistor M18 wherein the source and body contact are coupled to VSS, the gate receives the NPG powergating control signal, and the drain provides the switched PGVSS supply voltage. The transistors of circuits 72 and 74 can both be thin oxide transistors.

Referring back to FIG. 6, when PPDVCC goes to VCC+0.4V to cause LPB to go to the boosted level, the $V_{GS}$ of transistor M2 becomes too large to use a thin oxide P-type device and a thicker oxide device should be used. For the same reason, transistors M3, M9 and M10 should be thicker oxide devices as well. These thicker oxide devices require longer transistor gate lengths and are slower than the thinner oxide and devices.

Figure 8:
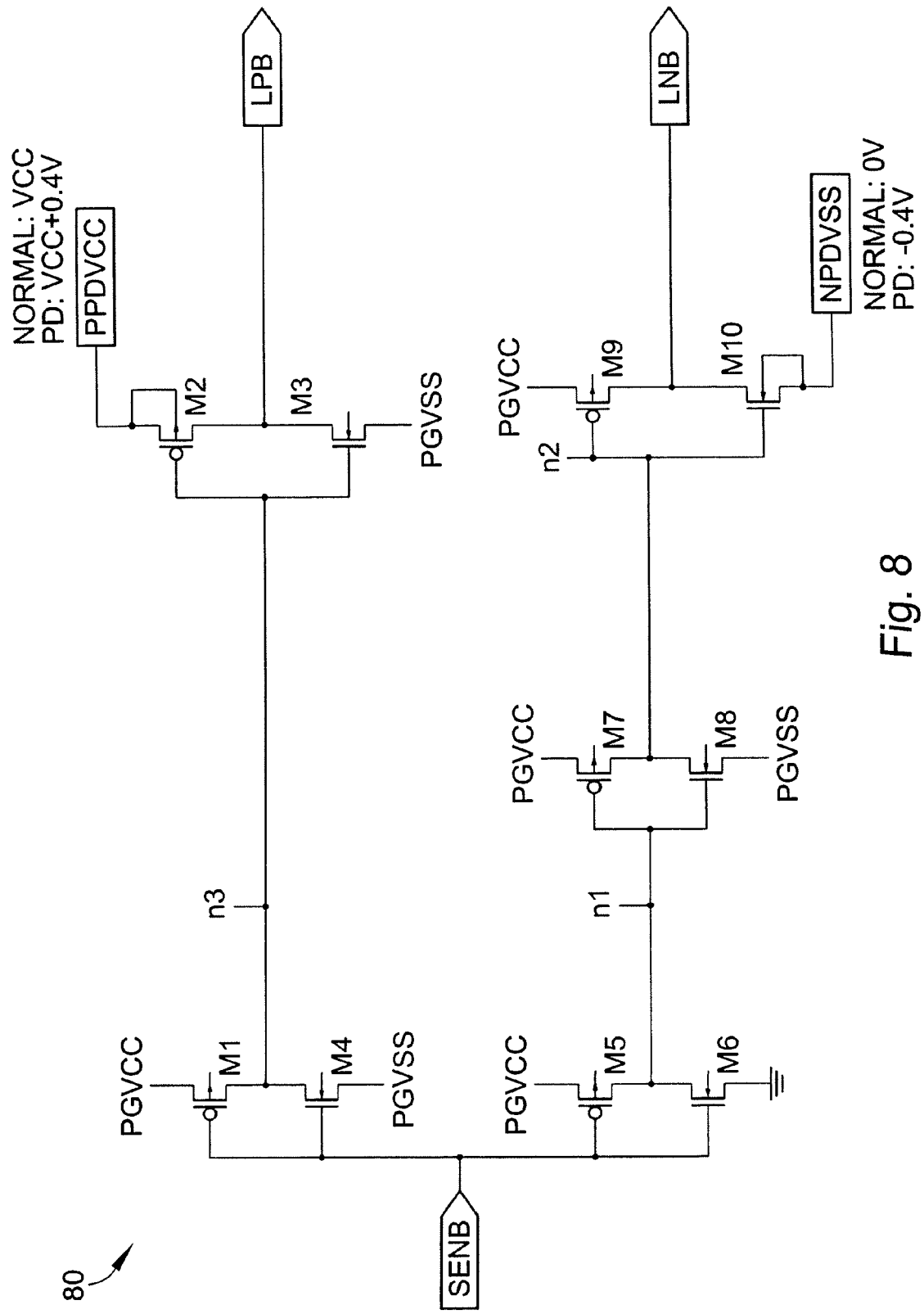
FIG. 8 is a schematic diagram showing a circuit for driving the latch nodes of a sense amplifier according to an embodiment of the present invention.

An improved sense amplifier driving circuit 80 according to an embodiment of the present invention is shown in FIG. 8, wherein the PGVCC and PGVSS voltages are clamped at the BLREF mid-point voltage during the standby or power down mode.

Circuit 80 includes a SENB control signal for switching the sense amplifier 50 between an active latching mode and a standby or power down mode through the LPB and LNB signals. A first inverter path includes serially connected inverters M1/M4 and M2/M3. Inverter M1/M4 is coupled between PGVCC and PGVSS. Inverter M2/M3 is coupled between the PPDVCC power supply and PGVSS. Transistors M1, M2, M3 and M4 are now all thin oxide transistors having a length of 0.07 µ. A second inverter path includes serially connected inverters M5/M6, M7/M8 and M9/M10. Inverter M5/M6 is coupled between PGVCC and VSS or ground. Inverter M7/M8 is coupled between PGVCC and PGVSS. Inverter M9/M10 is coupled between PGVCC and the NPDVSS power supply. Transistors M5, M6, M7, M8, M9, and M10 are now all thin oxide transistors having a length of 0.07 µ.

Figure 9:
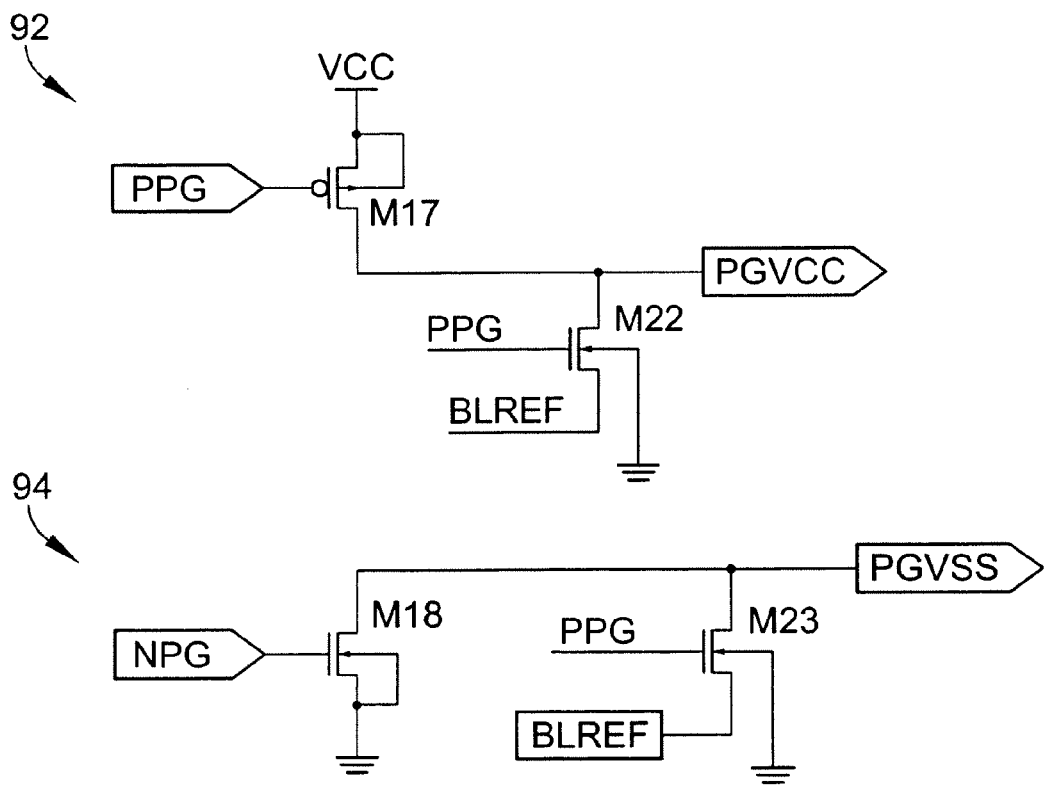
FIG. 9 is a schematic diagram showing a circuit for providing the internal switched VCC and VSS power supply voltages to the circuit of FIG. 8, including a provision for supplying a fixed bit line reference voltage during a standby mode.

Referring to FIG. 9, circuits 92 and 94 are shown for providing the PGVCC and PGVSS internal switched power supply voltages according to an embodiment of the present invention, wherein the power supply voltages are forced to the BLREF mid-point reference voltage during the standby mode.

Circuit 92 is a P-channel transistor M17 wherein the source and body contact are coupled to VCC, the gate receives the PPG powergating control signal, and the drain provides the switched PGVCC supply voltage. In addition, circuit 92 includes N-channel transistor M22 having a source/drain for receiving the BLREF reference voltage, a body contact coupled to ground or VSS, a gate for receiving the PPG control signal, and another source/drain coupled to PGVCC.

Circuit 94 is an N-channel transistor M18 wherein the source and body contact are coupled to VSS, the gate receives the NPG powergating control signal, and the drain provides the switched PGVSS supply voltage. In addition, circuit 92 includes N-channel transistor M23 having a source/drain for receiving the BLREF reference voltage, a body contact coupled to ground or VSS, a gate for receiving the PPG control signal, and another source/drain coupled to PGVSS.

The transistors of circuits 92 and 94 can all be thin oxide transistors under boosted or non-boosted operating conditions.

Referring back to FIG. 8, when PPDVCC goes to VCC+ 0.4V to cause LPB to go to the boosted level, the $V_{GS}$ of transistor M2 is not too large to use a thin oxide P-type device since the gate is clamped to the BLREF reference voltage. For the same reason, transistors M3, M9 and M10 can all be thinner oxide devices as well.

By changing the source of transistors M4 and M7 to the powergated supplies and then forcing PGVCC and PGVSS to BLREF during powerdown, nodes N3 and N2 go to BLREF instead of ground and VCC. This lowers the electric field on transistors M2, M3, M9 and M10 and allows these devices to be thin oxide devices. Circuit 80 can therefore be made smaller and faster than circuit 60, since the minimum length for thin devices is smaller than the minimum length for medium or thick devices. Also the widths of thin oxide devices can also be made much smaller due to the higher drive capability. The only additional circuitry required is transistors M22 and M23 shown in FIG. 9. The reduced drive on transistors M10 and M2 shown in FIG. 8 is acceptable since this takes place in the standby condition. It is also acceptable if the LNB and LPB nodes take a long time to get to the PPDVCC and NPDVSS levels. The zero volt VGS on transistors M9 and M3 are also acceptable since their body contacts are held to VCC and VSS or PPDVCC and NPDVSS and therefore a large back-gate effect helps to raise their threshold voltages.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A powergating circuit comprising:
    a P-channel transistor having a source coupled to a first voltage source, a gate for receiving a first control signal, and a drain forming a first gated node;
    an N-channel transistor having a source coupled to a second voltage source, a gate for receiving a second control signal, and a drain forming a second gated node;
    a controlled circuit having a first power node coupled to the first gated node and a second power node coupled to the second gated node;
    a first inverter having an input and an output for providing the first control signal;
    a second inverter having an input and an output for providing the second control signal; and
    means for forcing the inputs of the first and second inverters to a mid-point reference voltage during a standby mode.

2. The powergating circuit of claim 1 wherein the first control signal is boosted above the level of the first voltage source during the standby mode.

3. The powergating circuit of claim 1 wherein the second control signal is boosted below the level of the second voltage source during the standby mode.

4. The powergating circuit of claim 1 wherein the controlled circuit comprises a sense amplifier.

5. The powergating circuit of claim 1 wherein the forcing means comprises:
    a third inverter having an output coupled to the input of the first inverter and having power terminals selectively coupled to the mid-point reference voltage; and
    a fourth inverter having an output coupled to the input of the third inverter and having power terminals selectively coupled to the mid-point reference voltage.

6. The powergating circuit of claim 1 wherein the mid-point reference voltage comprises a bit line reference voltage.

* * * * *